United States Patent
Nakajyo et al.

(12)
(10) Patent No.: US 6,420,213 B1
(45) Date of Patent: Jul. 16, 2002

(54) METHOD FOR FIXING A SEMICONDUCTOR DEVICE HAVING STUD BUMPS TO A SUBSTRATE BY AN ELECTRICALLY NON-CONDUCTIVE ADHESIVE

(75) Inventors: Shinsuke Nakajyo; Masanori Onodera; Masamitsu Ikumo, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/653,334

(22) Filed: Aug. 31, 2000

(30) Foreign Application Priority Data

Feb. 23, 2000 (JP) .......................... 2000-046621

(51) Int. Cl.⁷ .................. H01L 21/44; H01L 21/48; H01L 21/50
(52) U.S. Cl. ................. 438/118; 438/124; 438/108
(58) Field of Search ................. 438/108, 118, 438/126

(56) References Cited

U.S. PATENT DOCUMENTS

| 5,030,308 A | * | 7/1991 | Sheyon et al. .............. 156/235 |
| 6,063,647 A | * | 5/2000 | Chen et al. .................. 438/108 |
| 6,121,689 A | * | 9/2000 | Capote et al. .............. 257/783 |
| 6,172,422 B1 | * | 1/2001 | Chigawa et al. ............ 257/778 |

FOREIGN PATENT DOCUMENTS

JP    10-189663    7/1998

* cited by examiner

Primary Examiner—Trung Dang
Assistant Examiner—William M. Brewster
(74) Attorney, Agent, or Firm—Armstrong, Westerman & Hattori, LLP

(57) ABSTRACT

A number of processes and the cost for mounting the semiconductor device are reduced by reducing the number of kinds of adhesives necessary for mounting the semiconductor device having a plurality of stud bumps to a mounting substrate. An electrically non-conductive adhesive is applied to a planer surface of a hard material member. The semiconductor device is attached to a bonding head. The stud bumps of the semiconductor device are leveled by being pressed against the planer surface of the hard material member by the bonding head. A predetermined amount of the electrically non-conductive adhesive can be applied to a mounting area of the semiconductor device by separating the semiconductor device from the planer surface of the hard material member. The semiconductor device is fixed to the mounting substrate by placing the semiconductor device on the mounting substrate and curing the electrically non-conductive adhesive on the mounting surface of the semiconductor device.

11 Claims, 14 Drawing Sheets

METHOD FOR FIXING A SEMICONDUCTOR DEVICE HAVING STUD BUMPS TO A SUBSTRATE BY AN ELECTRICALLY NON-CONDUCTIVE ADHESIVE

BACKGROUND OF THE INVENTION

1. Field of the Invention

The present invention generally relates to a method for mounting a semiconductor device and, more particularly, to a method for fixing a semiconductor device having stud bumps to a mounting substrate by using an adhesive.

Recently, in order to reduce a mounting area of a mounting substrate to satisfy the demand of miniaturizing electronic equipment, semiconductor devices are reduced in their size and, thus, the pitches of their terminals are reduced. As a means of reducing the mounting area, there is a flip-chip mounting method to mount a bare chip on a mounting surface. In the flip-chip mounting method, the bare chip is generally fixed to the mounting substrate by an adhesive.

2. Description of the Related Art

There are the following two methods to apply an adhesive for mounting a semiconductor device in the flip-chip mounting method.

1) A semiconductor device is mounted to a mounting substrate after an adhesive is applied to the mounting substrate.

2) An adhesive is applied between a mounting substrate and a semiconductor device after the semiconductor device is mounted on the mounting substrate.

FIG. 1 is a flowchart of a mounting process for mounting a semiconductor device by using the above-mentioned method 1). FIG. 2 is an illustration for explaining the mounting process shown in FIG. 1.

In the mounting process shown in FIG. 1, after stud bumps 2 are formed on a semiconductor device 1, the stud bumps 2 are subjected to leveling so as to equalize the height of the stud bumps 2. The leveling is performed by pressing the stud bumps 2 against a hard material plate 3 such as a ceramics plate.

That is, as shown in FIG. 2-(a), the semiconductor device 1 having the stud bumps 2 is held by a tool 4 (step S1 of FIG. 2), and, then, the stud bumps 2 are pressed against the hard material plate 3. At this time, an electrically conductive adhesive 5 is previously applied to the hard material plate 3 so that the electrically conductive adhesive 5 is transferred to the stud bumps 2 during the leveling process (step S2).

Thereafter, the position recognition of the semiconductor mounting area of the mounting substrate 6 is performed (step S3). Then, as shown in FIG. 2-(b), an electrically non-conductive adhesive 7 is applied to the semiconductor mounting area of the mounting substrate 6 (step S4). The electrically non-conductive adhesive 7 is supplied so as to fill a space between the mounting surface of the semiconductor device 1 and the mounting substrate 6. That is, the electrically non-conductive adhesive 7 has the insulating property so as to protect the electrodes on the semiconductor device 1 and the mounting substrate 6.

On the other hand, the electrically conductive adhesive 5 is supplied so as to connect the stud bumps 2 to the lands 6a of the mounting substrate 6. Thus, the electrically conductive adhesive 5 provides a different function from the electrically non-conductive adhesive 7. After the electrically non-conductive adhesive 7 is applied to the semiconductor mounting area of the mounting substrate 6 as shown in FIG. 2-(c), the semiconductor device 1 is placed on the mounting substrate 6 as shown in FIG. 2-(d) and the electrodes of the semiconductor device 1 are bonded to the lands 6a of the mounting substrate 6 by applying a heat (step S5). The non-conductive adhesive 7 is also cured by the heat provided to bond the stud bumps 2.

FIG. 3 is a flowchart of a mounting process for mounting a semiconductor device by using the above-mentioned method 2). FIG. 4 is an illustration for explaining the mounting process shown in FIG. 3.

Similar to the method shown in FIG. 1, in the mounting process shown in FIG. 3, after the stud bumps 2 are formed on a semiconductor device 1, the stud bumps 2 are subjected to leveling so as to equalize the height of the stud bumps 2. The leveling is performed by pressing the stud bumps 2 against the hard material plate 3 such as a ceramics plate.

That is, as shown in FIG. 4-(a), the semiconductor device 1 having the stud bumps 2 is held by a tool 4 (step S11 of FIG. 3), and, then, the stud bumps 2 are pressed against the hard material plate 3. At this time, the electrically conductive adhesive 5 is previously applied to the hard material plate 3 so that the electrically conductive adhesive 5 is transferred to the stud bumps 2 during the leveling process (step S12).

Thereafter, as shown in FIG. 4-(b), the position recognition of the semiconductor mounting area of the mounting substrate 6 is performed (step S13). Then, as shown in FIG. 4-(c), the semiconductor device 1 is placed on the semiconductor mounting area of the mounting substrate 6 (step S14). In this state, the stud bumps 2 are electrically connected to the lands 6a of the mounting substrate 6 by the electrically conductive adhesive 5 on the stud bumps 2.

Thereafter, as shown in FIG. 4-(d), the electrically non-conductive adhesive 7 is supplied between the semiconductor 1 and the semiconductor substrate 6 (step S15).

In the above-mentioned mounting methods, the semiconductor device 1 is mounted to the mounting substrate 6 by the flip-chip mounting method by using the stud bumps 2. In a state in which the stud bumps 2 are formed on the semiconductor device 1, the height of the stud bumps 2 are not uniform. Accordingly, the leveling of the stud bumps 2 is performed so that all stud bumps 2 are put in contact with the respective lands 6a of the mounting substrate 6. In the conventional methods, the electrically conductive adhesive 5 is applied to the stud bumps 2 at the same time when the leveling is performed. Then, the semiconductor substrate 1 is fixed to the mounting substrate 6 mainly by the non-conductive adhesive 7.

As mentioned above, since the two kinds of adhesives, the electrically conductive adhesive and the electrically non-conductive adhesive, are used in the conventional flip-chip mounting method, the adhesives must be applied by the different processes which results in an increase in the number of processes. Accordingly, there is a problem in that the tact of the mounting process is long.

Additionally, there is a problem in that the electrically conductive adhesive is more expensive than the electrically non-conductive adhesive since the electrically conductive adhesive used for the conventional flip-chip mounting method is prepared by adding electrically conductive particles to an electrically non-conductive adhesive as a base.

Further, the facility cost of the semiconductor device mounting apparatus occupies a large weight in the entire facility cost relating with the flip-chip mounting. Accordingly, an increase in the manufacturing efficiency of the semiconductor device mounting apparatus greatly contributes the reduction in the manufacturing cost of the semiconductor device. In the flip-chip mounting method using the stud bumps, a thermosetting resin is used as the electrically non-conductive adhesive. Since the thermosetting resin takes a relatively long curing time such as 20 seconds to mount a single semiconductor device, there is a problem in that a manufacturing efficiency is not high.

SUMMARY OF THE INVENTION

It is a general object of the present invention to provide an improved and useful mounting method of a semiconductor device in which the above-mentioned problems are eliminated.

A more specific object of the present invention is to provide a mounting method of a semiconductor device, which reduces the number of processes and the cost for mounting the semiconductor device by reducing the number of kinds of adhesives necessary for mounting the semiconductor device.

In order to achieve the above-mentioned objects, there is provided according to one aspect of the present invention a method for mounting a semiconductor device having a plurality of stud bumps to a mounting substrate, the method comprising the steps of:

applying an electrically non-conductive adhesive to a planer surface of a hard material member;

attaching the semiconductor device to a bonding head;

leveling the stud bumps of the semiconductor device by pressing the stud bumps against the planer surface of the hard material member by the bonding head, and transferring a predetermined amount of the electrically non-conductive adhesive to a mounting area of the semiconductor device by separating the semiconductor device from the planer surface of the hard material member; and fixing the semiconductor device to the mounting substrate by placing the semiconductor device on the mounting substrate and curing the electrically non-conductive adhesive on the mounting surface of the semiconductor device.

According to the above-mentioned invention, only the electrically non-conductive adhesive is used and the electrically conductive adhesive 5 used in the conventional mounting method is not used. That is, the electrically non-conductive adhesive can be applied to the semiconductor device instead of the electrically conductive adhesive in the conventional process in which the electrically conductive adhesive is applied to the semiconductor device. Accordingly, there is no need to perform the process for applying the electrically conductive adhesive, and, instead, the electrically non-conductive adhesive is applied to the semiconductor device simultaneously with the leveling of the stud bumps.

As mentioned above, by applying the electrically non-conductive adhesive to the semiconductor device while the leveling is performed, there is no need to perform the process for applying the electrically non-conductive adhesive alone. Therefore, the number of processes to be performed is reduced, and the tact of the mounting process is also reduced. Additionally, since the expensive electrically conductive adhesive is not used, the material cost can be reduced.

In one embodiment of the present invention, the electrically non-conductive adhesive may be in the form of a film so that the film is applied to the planet surface of the hard material member.

Additionally, there is provided according to another aspect of the present invention a method for mounting a semiconductor device having a plurality of stud bumps to a mounting substrate, the method comprising the steps of:

applying an electrically non-conductive adhesive to a planer surface of a hard material member, the electrically non-conductive adhesive made of a thermosetting resin;

attaching the semiconductor device to a bonding head;

leveling the stud bumps of the semiconductor device by pressing the stud bumps against the planer surface of the hard material member by the bonding head, and heating the bonding head so as to heat the electrically non-conductive adhesive via the semiconductor device, and transferring a predetermined amount of the electrically non-conductive adhesive to a mounting area of the semiconductor device by separating the semiconductor device from the planer surface of the hard material member; and fixing the semiconductor device to the mounting substrate by placing the semiconductor device on the mounting substrate and thermally curing the electrically non-conductive adhesive on the mounting surface of the semiconductor device.

According to the above-mentioned invention, the electrically non-conductive adhesive is made of a thermosetting resin, and the heating of the bonding head heat is started from the step of applying the electrically non-conductive adhesive to the semiconductor device. Accordingly, the electrically non-conductive adhesive has been cured to a certain level when the semiconductor device is mounted to the mounting substrate. Thus, the curing time of the electrically non-conductive adhesive after the semiconductor device is mounted can be reduced.

Additionally, there is provided according to another aspect of the present invention a method for mounting a semiconductor device having a plurality of stud bumps to a mounting substrate, the method comprising the steps of:

applying an electrically non-conductive adhesive to a planer surface of a hard material member, the electrically non-conductive adhesive made of a thermosetting resin;

attaching the semiconductor device to a bonding head;

leveling the stud bumps of the semiconductor device by pressing the stud bumps against the planer surface of the hard material member by using the bonding head after being heated, and heating the bonding head so as to heat the electrically non-conductive adhesive via the semiconductor device and transferring a predetermined amount of the electrically non-conductive adhesive to a mounting area of the semiconductor device by separating the semiconductor device from the planer surface of the hard material member; and fixing the semiconductor device to the mounting substrate by placing the semiconductor device on the mounting substrate and thermally curing the electrically non-conductive adhesive on the mounting surface of the semiconductor device.

According to the above-mentioned invention, the electrically non-conductive adhesive is made of a thermosetting resin, and the previously heated bonding head is used in the step of applying the electrically non-conductive adhesive to the semiconductor device. Accordingly, the electrically non-conductive adhesive has been cured to a certain level when the semiconductor device is mounted to the mounting substrate. Thus, the curing time of the electrically non-conductive adhesive after the semiconductor device is mounted can be reduced.

In the above-mentioned invention, the electrically non-conductive adhesive may be in the liquid state when being applied to the planer surface of the hard material member so that the electrically non-conductive adhesive on the planer surface has a uniform thickness. Accordingly, a predetermined amount of the electrically non-conductive adhesive can be applied to the semiconductor device by performing the leveling of the stud bumps.

Additionally, the semiconductor device may be separated from the hard material member after the electrically non-conductive adhesive becomes a gelatinized state by being heated in the process of transferring the electrically non-conductive material. Accordingly, an end surface of each of the stud bumps is exposed on the surface of the gelatinized electrically non-conductive adhesive. Additionally, the gelatinized electrically non-conductive adhesive has a strong adhesion force.

Since the gelatinized electrically non-conductive adhesive has a low fluidity, the semiconductor device can be fixed to the mounting surface by the electrically non-conductive adhesive by merely placing the semiconductor device on the mounting substrate. Thus, the mounting substrate can be subjected to another process immediately after the semiconductor device is mounted thereon.

Additionally, there is provided according to another aspect of the present invention a method for mounting a plurality of semiconductor devices to a mounting substrate by using a plurality of bonding heads, wherein the method uses the process of mounting according to the above mentioned methods according to the present invention, and the process of mounting is sequentially repeated with respect to each of the bonding heads in a manner in which the process of mounting with respect to one of the bonding heads are shifted by one step from the process of mounting with respect to another one of the bonding heads.

By performing the process of mounting by shifting the steps one by one from one bonding head to another bonding head, a higher productivity of the semiconductor device can be achieved than a case in which the mounting process is performed by using a single bonding head. In order to achieve a plurality of mounting processes by shifting the steps one by one, the tact of the processes of the steps must be substantially equal to each other. Otherwise the efficiency of the entire mounting process may be decreased. According to the above-mentioned invention, the curing time of the electrically non-conductive adhesive can be reduced or substantially eliminated, and, thereby, the tact of the step of fixing the semiconductor device to the mounting substrate including the curing of the electrically non-conductive adhesive can be substantially equal to the tact of other steps. Thus, the process of mounting can be performed by a plurality of bonding heads without decreasing the efficiency due to a difference in the tact.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to FIGS. 5 and 6, of a semiconductor device mounting process, which uses a semiconductor mounting method according to the present invention.

Figure 1:
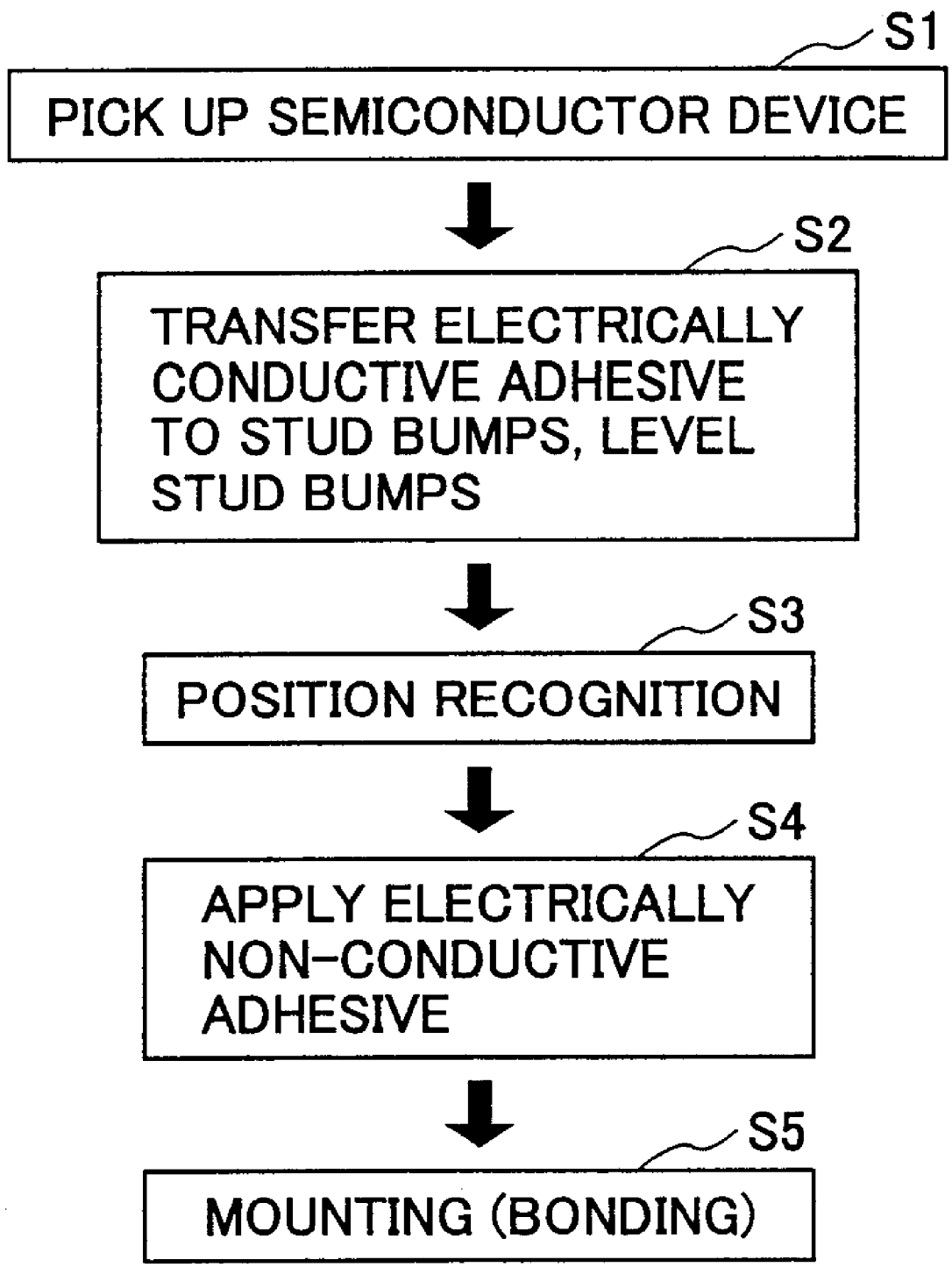
FIG. 1 is a flowchart of a semiconductor mounting process for mounting a semiconductor device by using a conventional mounting method.
Figure 2:
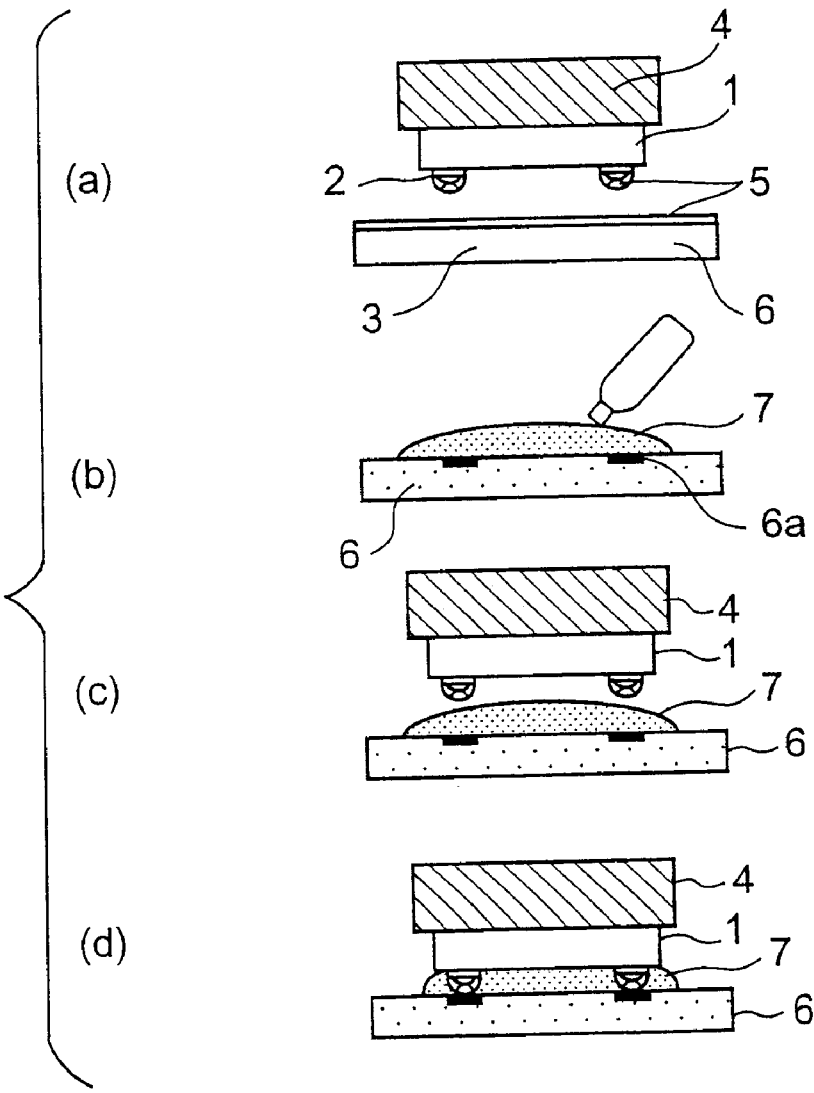
FIG. 2 is an illustration for explaining the semiconductor mounting process shown in FIG. 1.
Figure 3:
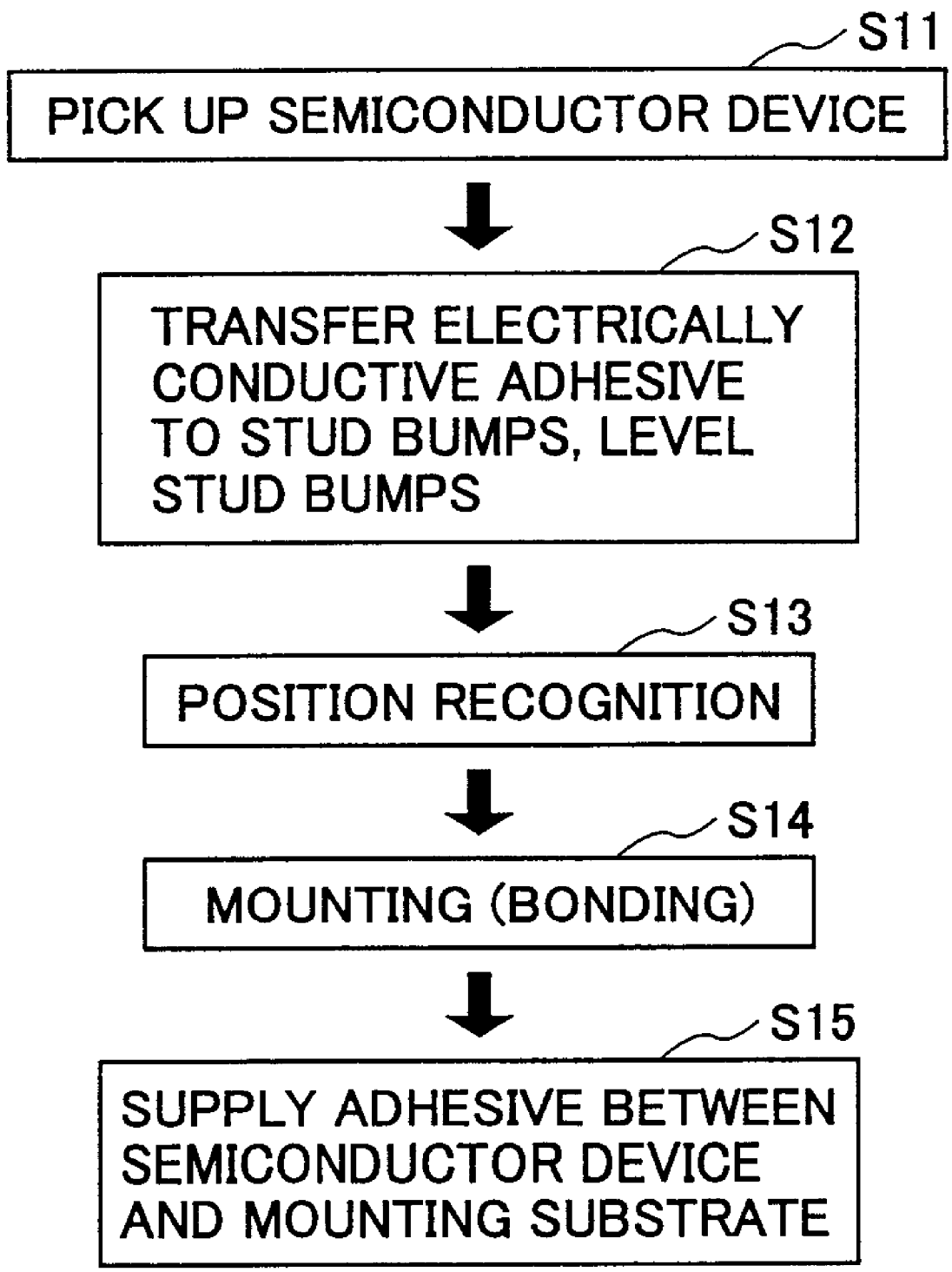
FIG. 3 is a flowchart of a semiconductor mounting process for mounting a semiconductor device by using another conventional mounting method.
Figure 4:
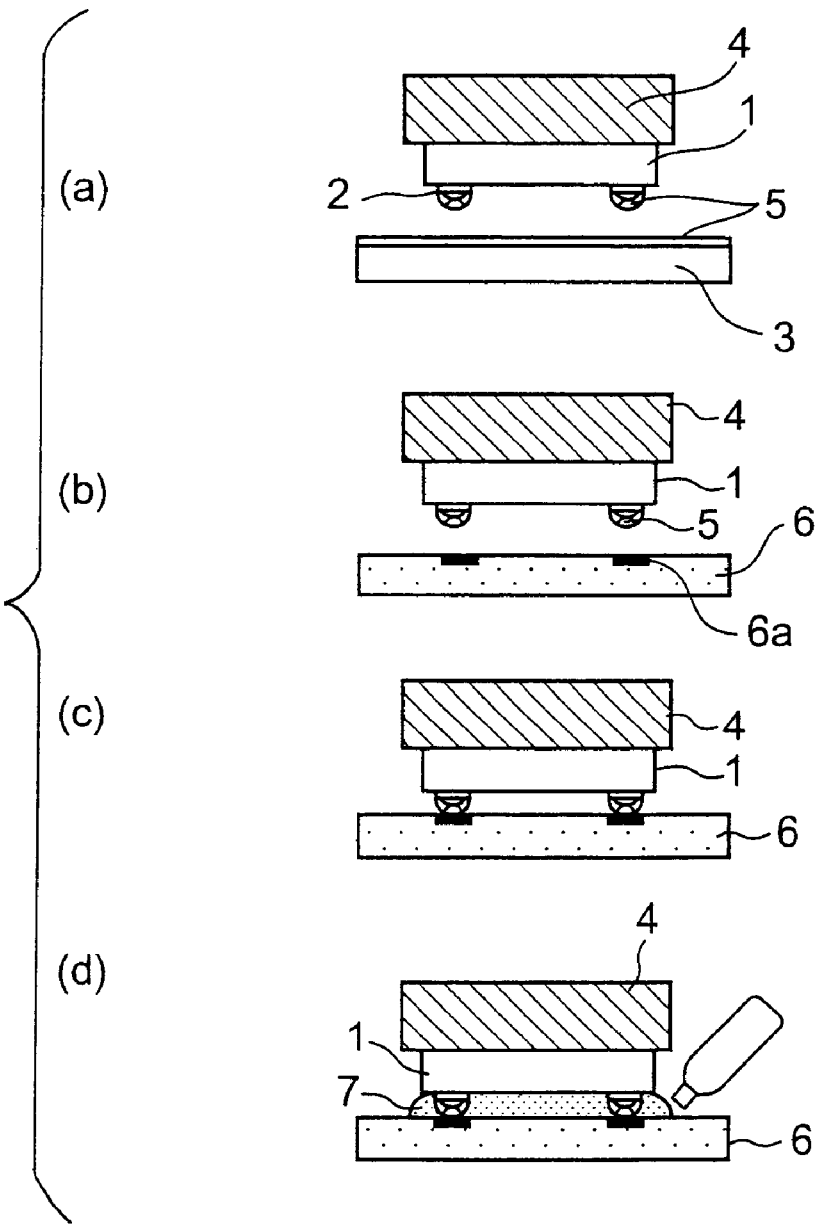
FIG. 4 is an illustration for explaining the semiconductor mounting process shown in FIG. 3.
Figure 5:
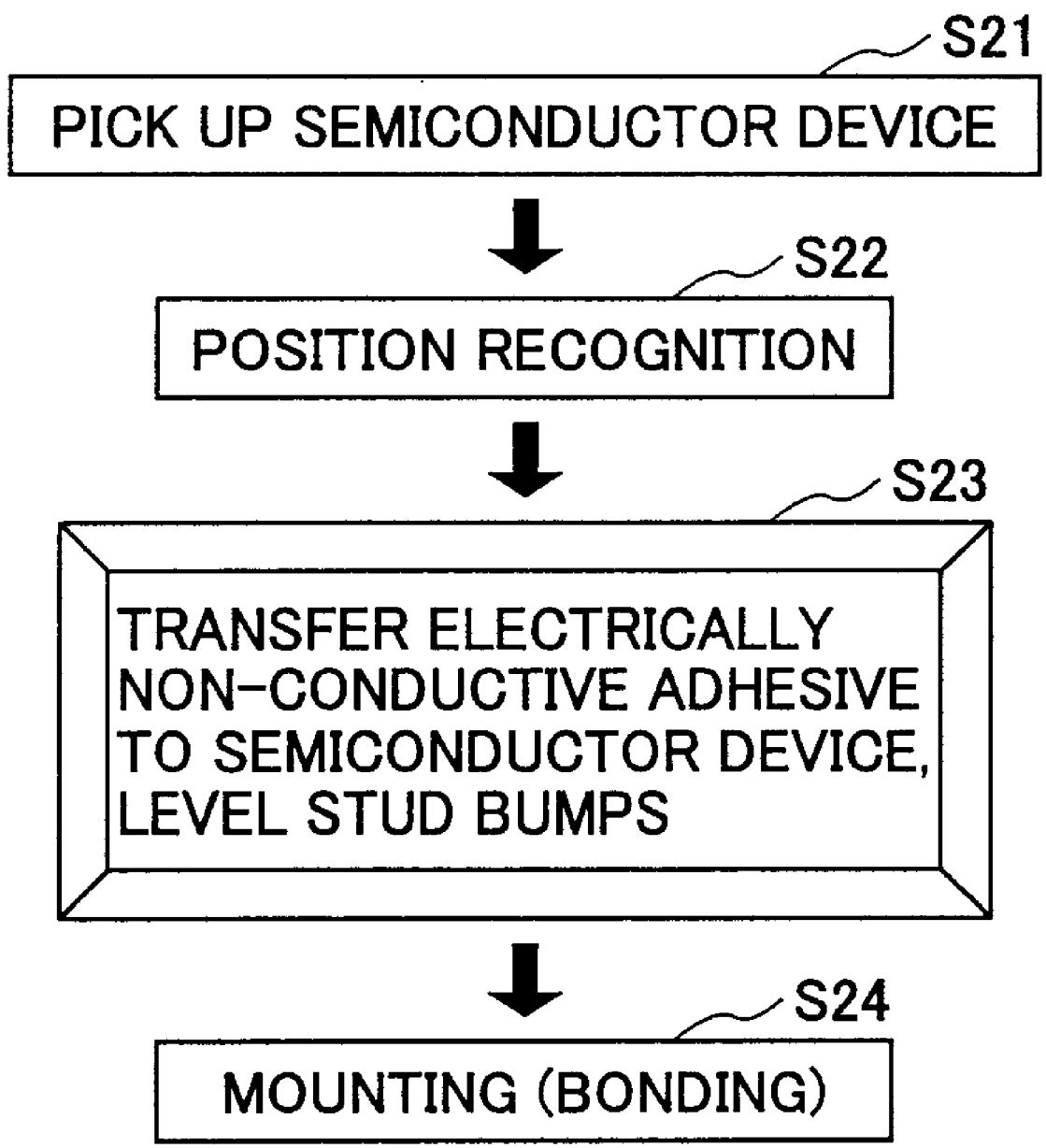
FIG. 5 is a flowchart of a semiconductor mounting process for mounting a semiconductor device by using a mounting method according to the present invention.

FIG. 5 is a flowchart of the semiconductor device mounting process, which uses a semiconductor mounting method according to the present invention. FIG. 6 is an illustration for explaining the semiconductor device mounting process shown in FIG. 5. In FIG. 6, parts that are the same as the parts shown in FIG. 2 are given the same reference numerals, and descriptions thereof will be omitted.

In the semiconductor device mounting method according to the present invention, similar to the conventional mounting method, the stud bumps 2 are subject to the leveling so as to equalize the height of the stud bumps 2 after the stud bumps 2 are formed on the semiconductor device 1. The leveling is performed by pressing the stud bumps 2 against the hard material plate 3 such as a ceramics plate.

First, the semiconductor device 1 on which the stud bumps 2 are formed is held by the tool (bonding head) 4 (step S21 of FIG. 5). Then, position recognition of the semiconductor device 1 is performed (step S22). Thereafter, the semiconductor device 1 is moved to a position above the hard material plate 3, and the stud bumps 2 are pressed against the hard material plate 3 (step S23). At this time, the electrically non-conductive adhesive 7 is transferred to the stud bumps 2 while the leveling is performed by previously applying the electrically non-conductive adhesive 7 to the hard material plate 3 as shown in FIG. 6-(a). The electrically non-conductive adhesive 7 is a thermosetting resin such as epoxy resin, and is supplied to fill a gap between the mounting surface of the semiconductor device 1 and the mounting substrate 6. That is, the electrically non-conductive adhesive has an electrically insulating characteristic, and is supplied to fix the semiconductor device 1 to the mounting substrate 6 and to protect the electrodes on the semiconductor device 1 and the mounting substrate 6. The reason for performing the position recognition of the semiconductor device 1 prior to the leveling is to eliminate a problem in that the position recognition mark provided on the semiconductor device 1 cannot be detected by image recognition due to the electrically non-conductive adhesive 7 adhering to the semiconductor device 1 at the same time the leveling is performed.

Figure 6:
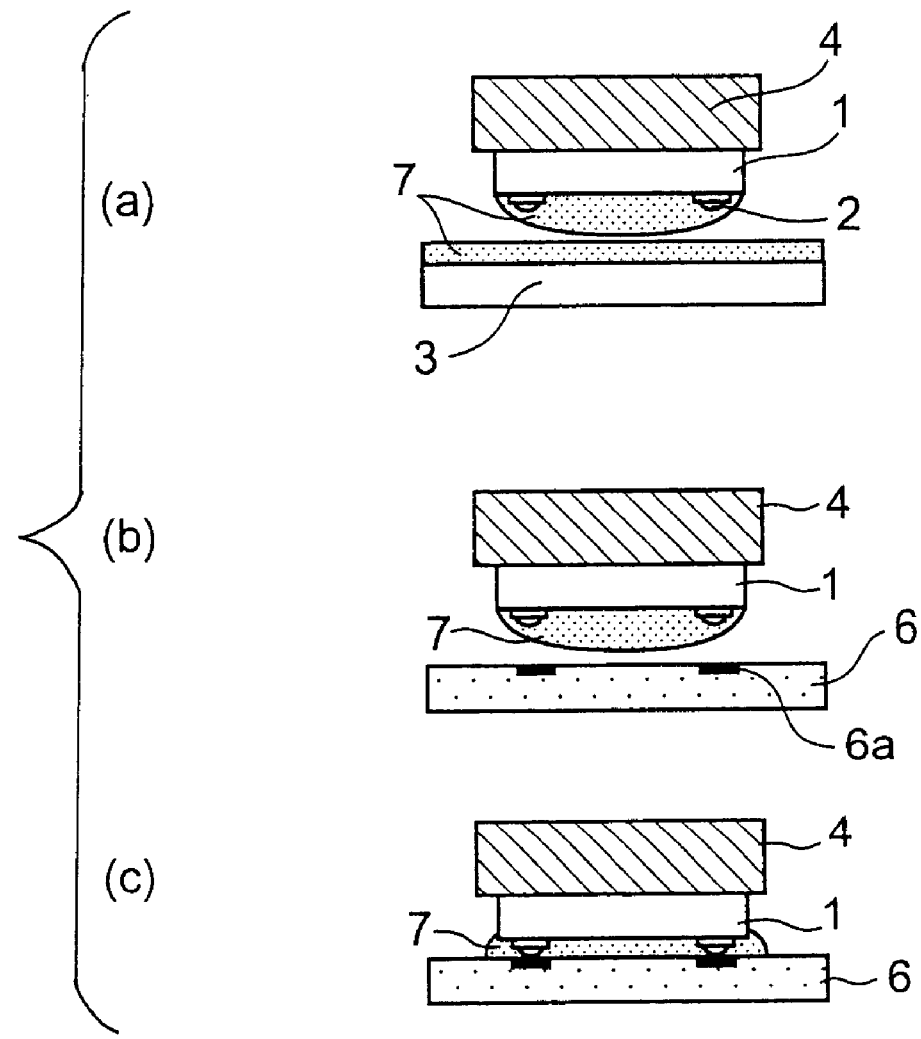
FIG. 6 is illustration for explaining the semiconductor mounting process shown in FIG. 5.

Then, as shown in FIG. 6-(b), the semiconductor device 1 to which the electrically non-conductive adhesive 7 is applied is moved to a position above the semiconductor mounting area of the mounting substrate 6. Then, as shown in FIG. 6-(c), the semiconductor device 1 is placed in the semiconductor mounting area of the mounting substrate 6. At this time, the electrically non-conductive adhesive 7 is filled in a gap between the semiconductor device 1 and the mounting substrate 6. Then, a heat is applied to the semiconductor device 1 so as to bond the stud bumps 2 to the lands 6a of the mounting substrate 6 and simultaneously cure the electrically non-conductive adhesive 7, and the mounting process is completed (step S24).

Figure 7:
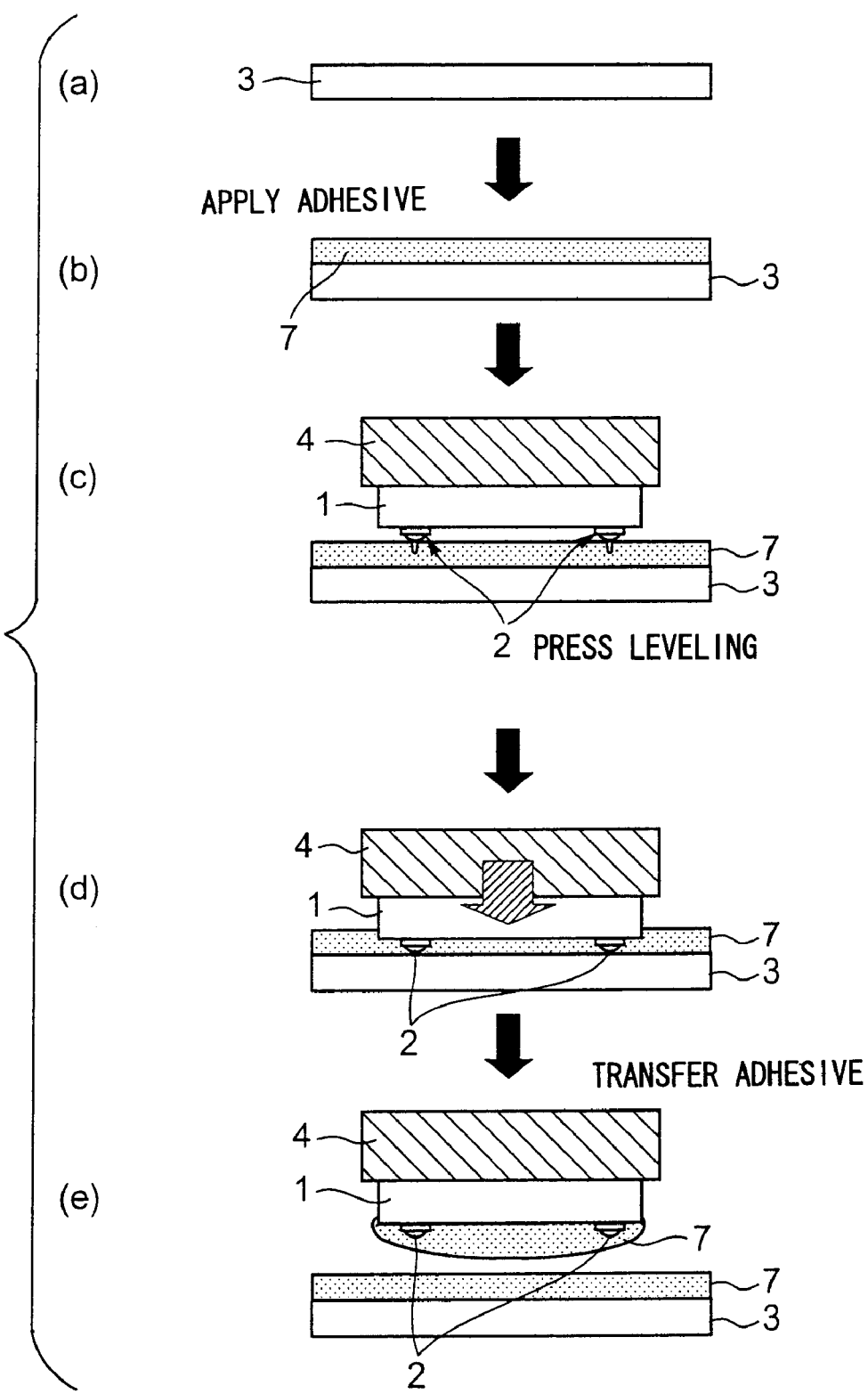
FIG. 7 is an illustration for explaining a semiconductor mounting method according to a first embodiment of the present invention.

A description will now be given, with reference to FIG. 7, of a first embodiment of the present invention. FIG. 7 is an illustration for explaining a semiconductor device mounting method according to the first embodiment of the present invention. In FIG. 7, parts that are the same as the parts shown in FIG. 2 are given the same reference numerals, and descriptions thereof will be omitted.

First, as shown in FIG. 7-(a), the hard material plate 3 having a planer surface is prepared. The hard material plate 3 is made of a hard material such as ceramics. Then, as shown in FIG. 7-(b), the electrically non-conductive adhesive in the state of liquid is applied to the hard material plate 3 with a uniform thickness.

Figure 8:
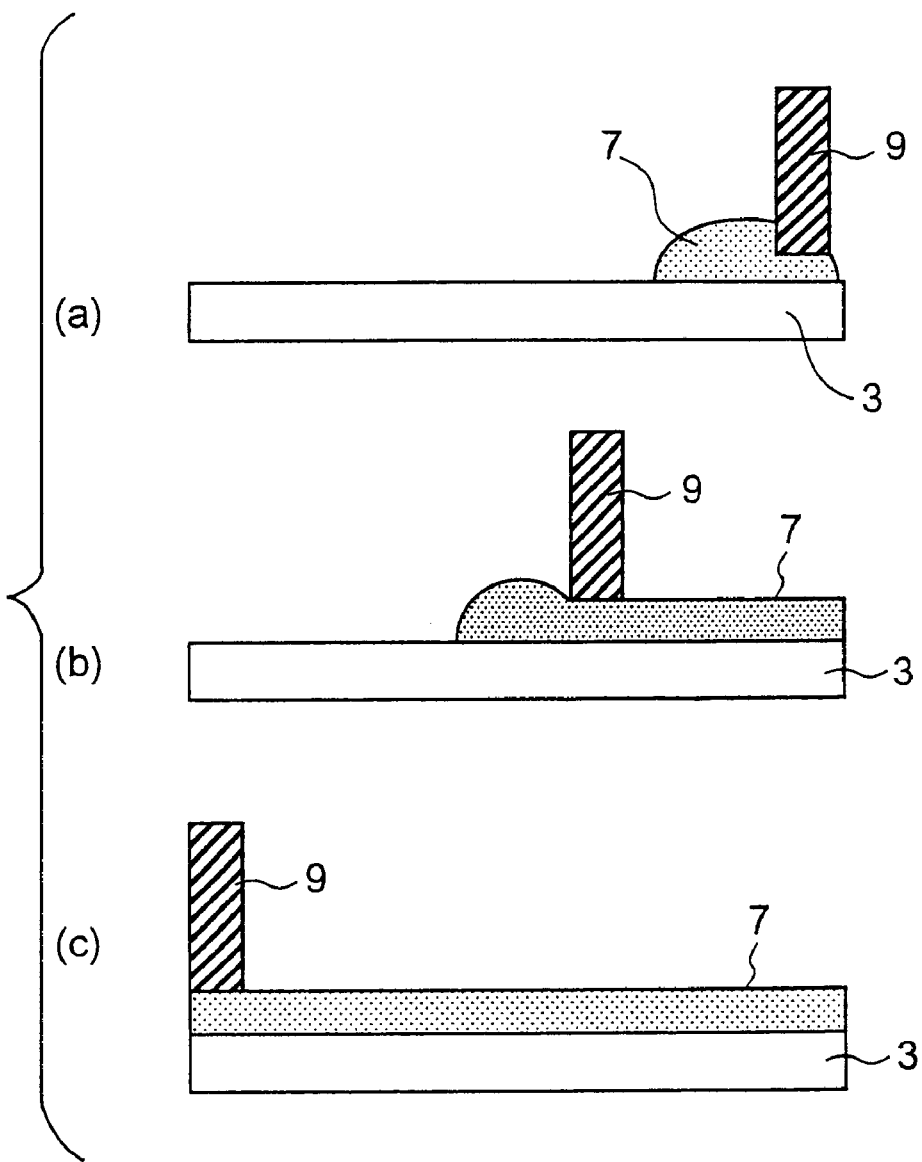
FIG. 8 is an illustration for explaining a process for applying a liquidized non-conductive adhesive to a hard material plate in a uniform thickness.

FIG. 8 is an illustration for explaining a process for applying the electrically non-conductive adhesive 7 to the hard material plate 3 with a uniform thickness. First, as shown in FIG. 8-(a), the electrically non-conductive adhesive 7 is supplied to a portion of the planer surface of the hard material plate 3. Then, as shown in FIG. 8-(b), a squeegee 9 is moved along the planer surface while mainlining the squeegee 9 a predetermined distance apart from the planer surface so that the electrically non-conductive adhesive 7 spreads on the planer surface with a uniform thickness. Thereby, as shown in FIG. 8-(c), the electrically non-conductive adhesive 7 is applied to the planer surface of the hard material plate 3 with a uniform thickness.

After the electrically non-conductive adhesive 7 is applied to the hard material plate 3, the semiconductor device 1 on which the stud bumps 2 are formed is held by the tool 4, and is moved to a position above the planer surface of the hard material plate 3 as shown in FIG. 7-(c). Then, as shown in FIG. 7-(d), the leveling of the stud bumps 2 is performed by pressing the stud bumps 2 of the semiconductor device 1 against the hard material plate 3 to deform the stud bumps 2. The stud bumps are formed of a metal such as gold (Au), aluminum (Al) or solder, which has a relatively high plastic deformability. The height of the stud bumps 2 after being leveled is generally about 50 im, and normally about 30 im.

After the leveling of the stud bumps 2 is completed, the semiconductor device is moved away from the hard material plate 3. As a result, a predetermined amount of the electrically non-conductive adhesive 7 adheres to the mounting surface of the semiconductor device 1 as shown in FIG. 7-(e). That is, the state shown in FIG. 7-(e) corresponds to the state shown in FIG. 6-(b). Thereafter, the semiconductor device 1 is moved to a position above the mounting substrate 6 while being held by the tool 4, and the semiconductor device 1 is mounted onto the mounting substrate 6.

As mentioned above, in the mounting method according to the first embodiment of the present invention, the electrically conductive adhesive 5 used in the conventional mounting method is not used, and the stud bumps 2 are directly bonded to the lands 6a of the mounting substrate 2. Accordingly, there is no need to perform the process for applying the electrically conductive adhesive 5, and instead the electrically non-conductive adhesive 7 is applied to the semiconductor device 1 simultaneously with the leveling of the stud bumps 2.

As mentioned above, by applying the electrically non-conductive adhesive 7 to the semiconductor device while the leveling is performed, there is no need to perform the process for applying the electrically non-conductive adhesive 7 alone. Therefore, the number of processes to be performed is reduced, and the tact of the mounting process is also reduced. Additionally, since the expensive electrically conductive adhesive is not used, the material cost can be reduced. As mentioned above, the mounting cost of the semiconductor device can be reduced by using the mounting method according to the first embodiment of the present invention.

Figure 9:
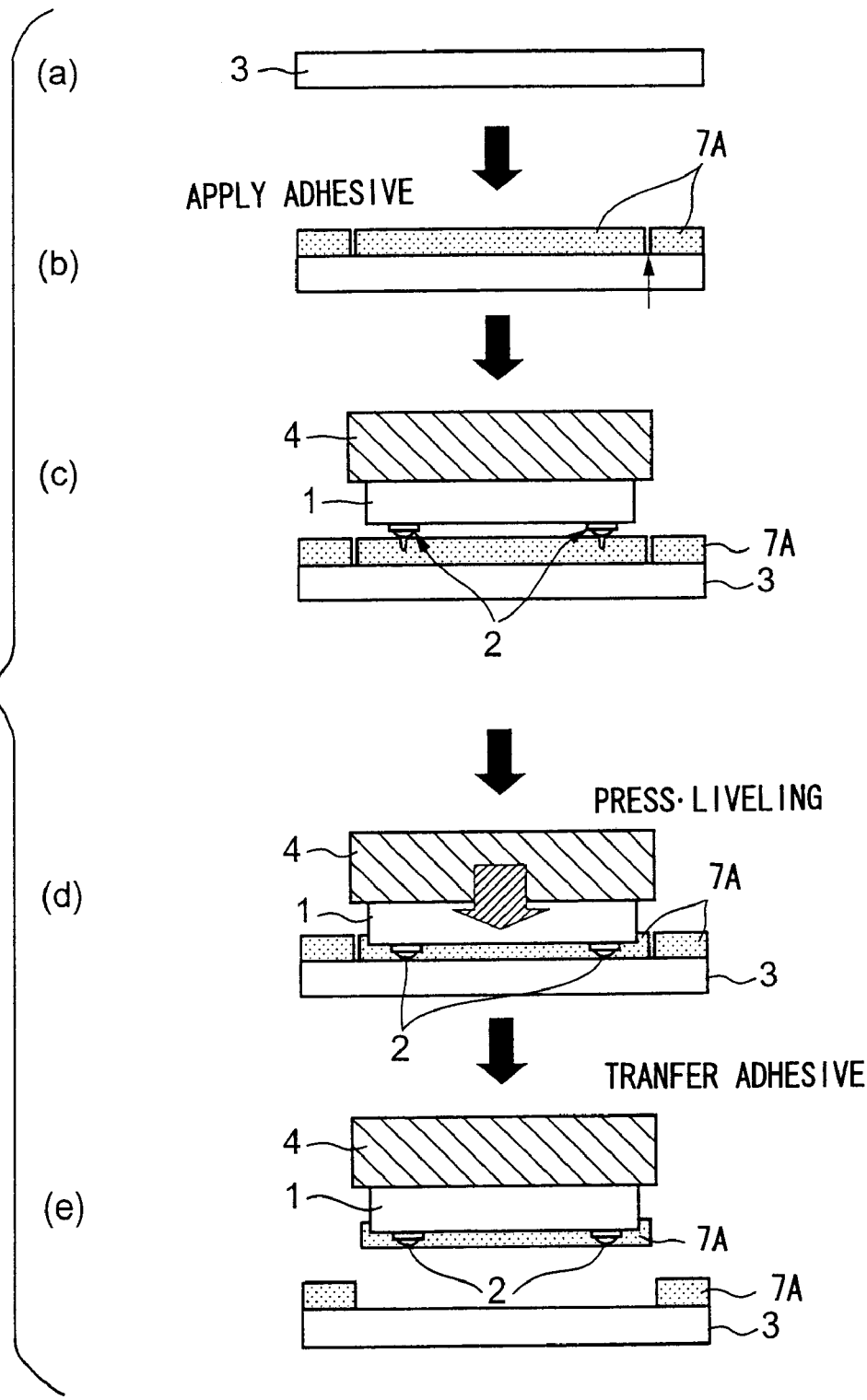
FIG. 9 is an illustration for explaining a semiconductor mounting method according to a second embodiment of the present invention.

A description will now be given, with reference to FIG. 9, of a second embodiment of the present invention. FIG. 9 is an illustration for explaining a semiconductor device mounting method according to the second embodiment of the present invention. In FIG. 9, parts that are the same as the parts shown in FIG. 2 are given the same reference numerals, and descriptions thereof will be omitted.

First, as shown in FIG. 9-(a), the hard material plate 3 having a planer surface is prepared. The hard material plate 3 is made of a hard material such as ceramics. Then, as shown in FIG. 9-(b), an electrically non-conductive adhesive 7 is applied to the hard material plate 3. In the present embodiment, the electrically non-conductive adhesive 7 is in the form of a film 7A having a uniform thickness. The electrically non-conductive adhesive film 7A is cut after being applied to the planer surface of the hard material plate 3 so that the cut piece of the electrically non-conductive adhesive film 7A has a size corresponding to the size of the semiconductor device 1.

Thereafter, as shown in FIG. 9-(c), the semiconductor device 1 on which the stud bumps 2 are formed is moved to a position above the planer surface of the hard material plate 3. At this time, the semiconductor device 1 is located directly above the electrically non-conductive film 7A, which has been cut into the size corresponding to the size of the semiconductor device 1.

Then, as shown in FIG. 9-(d), the stud bumps 2 of the semiconductor device 1 are pressed against the planer surface of the hard material plate 3 by the tool 4 so as to level the stud bumps 2. After the leveling is completed, the semiconductor device 1 is moved away from the hard material plate 3. Thereby, as shown in FIG. 9-(e), the electrically non-conductive film 7A having a predetermined size remains on the mounting surface of the semiconductor device 1.

That is, the state shown in FIG. 9-(e) corresponds to the state shown in FIG. 6-(b). Thereafter, the semiconductor device 1 is moved to a position above the mounting substrate 6 while being held by the tool 4, and the semiconductor device 1 is mounted onto the mounting substrate 6.

As mentioned above, in the mounting method according to the second embodiment of the present invention, the electrically conductive adhesive 5 used in the conventional mounting method is not used, and the stud bumps 2 are directly bonded to the lands 6a of the mounting substrate 2. Accordingly, there is no need to perform the process for applying the electrically conductive adhesive 5, and instead the electrically non-conductive adhesive film 7A is applied to the semiconductor device 1 simultaneously with the leveling of the stud bumps 2.

As mentioned above, by applying the electrically non-conductive adhesive film 7A to the semiconductor device while the leveling is performed, there is no need to perform the process for applying the electrically non-conductive adhesive 7 alone. Therefore, the number of processes to be performed is reduced, and the tact of the mounting process is also reduced. Additionally, since the expensive electrically conductive adhesive is not used, the material cost can be reduced. Further, since the electrically non-conductive adhesive is in the form a film, the electrically non-conductive adhesive can be cut into a predetermined size on the hard material plate 3, which allows easy adjustment of an amount of the electrically non-conductive adhesive being applied to the semiconductor device 1.

As mentioned above, the mounting cost of the semiconductor device can be reduced by using the mounting method according to the second embodiment of the present invention.

Figure 10:
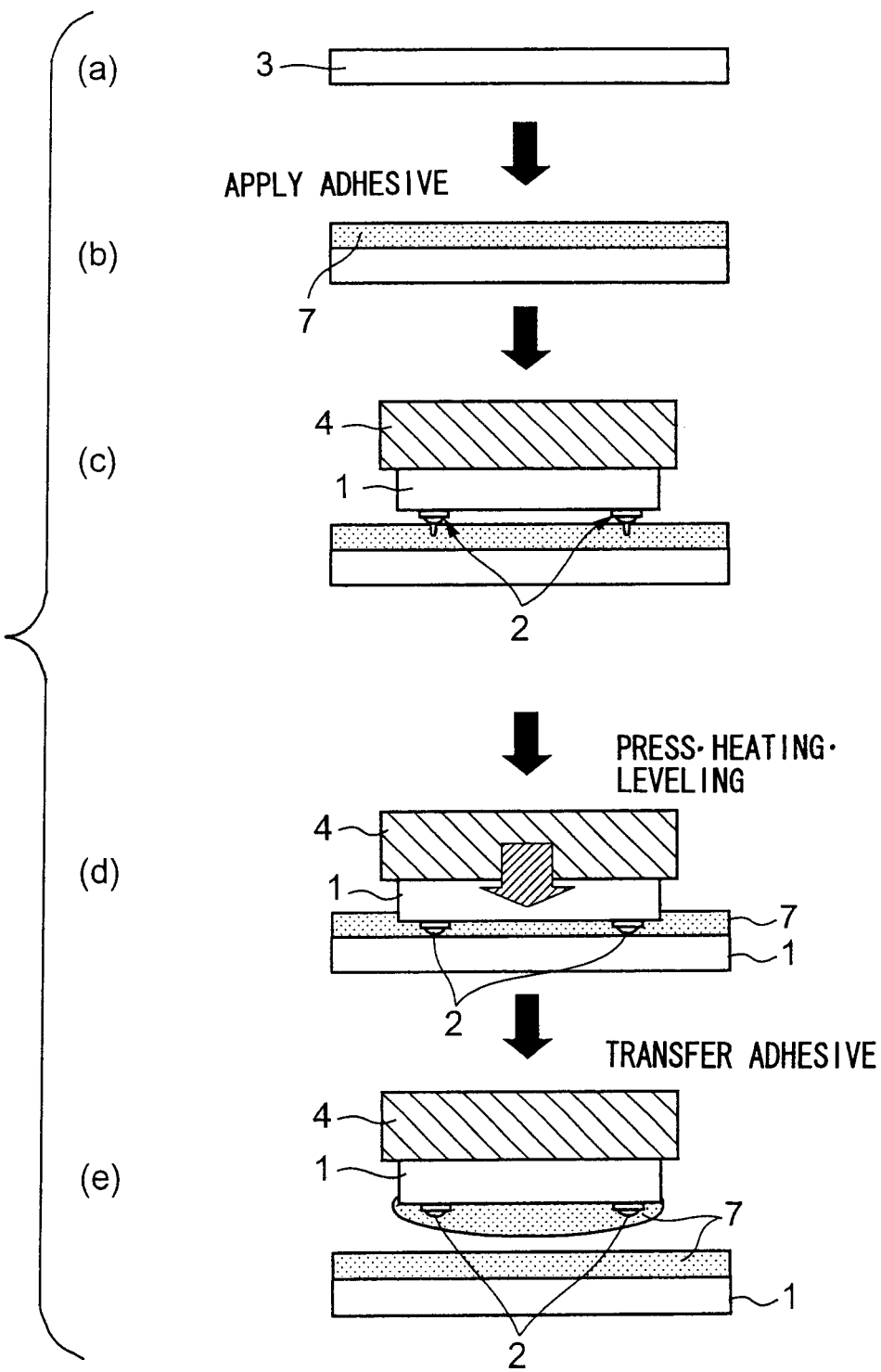
FIG. 10 is an illustration for explaining a semiconductor mounting method according to a third embodiment of the present invention.

A description will now be given, with reference to FIG. 10, of a third embodiment of the present invention. FIG. 10 is an illustration for explaining a semiconductor device mounting method according to the third embodiment of the present invention. In FIG. 10, parts that are the same as the parts shown in FIG. 2 are given the same reference numerals, and descriptions thereof will be omitted.

First, as shown in FIG. 10-(a), the hard material plate 3 having a planer surface is prepared. The hard material plate 3 is made of a hard material such as ceramics. Then, as shown in FIG. 10-(b), the electrically non-conductive adhesive in the state of liquid is applied to the hard material plate 3 with a uniform thickness.

A process for applying the electrically non-conductive adhesive 7 with a uniform thickness is the same as the process explained in the above-mentioned first embodiment with reference to FIG. 8, and descriptions thereof will be omitted.

After the electrically no-conductive adhesive 7 in the form of liquid is applied to the planer surface of the hard material plate 3, the semiconductor device 1 on which the stud bumps 2 are formed is held by the tool 4 and is moved to a position above the hard material plate 3 as shown in FIG. 10-(c). Then, as shown in FIG. 10-(d), the stud bumps 2 are subject to leveling by being pressed against the planer surface of the hard material plate 3. At this time, the tool 4 is heated while the tool 4 presses the semiconductor device 1 for the leveling. Thereby, the curing reaction of the electrically non-conductive material 7 applied to the semiconductor device 1 is initiated.

After the leveling of the stud bumps 2 is completed, the semiconductor device 1 is moved away from the hard material plate 3. Thereby, a predetermined amount of the electrically non-conductive adhesive 7 adheres to the mounting surface of the semiconductor device 1. That is, the state shown in FIG. 10-(e) corresponds to the state shown in shown in FIG. 6-(b). Thereafter, the semiconductor device 1 is moved to a position above the mounting substrate 6 while being held by the tool 4, and the semiconductor device 1 is mounted onto the mounting substrate 6. The tool 4 is heated according to a pulse heat method so that the tool 4 is controlled to be at an appropriate temperature from the time the semiconductor device 1 is mounted to the mounting substrate 6 until the cure of the electrically non-conductive adhesive 7 advances.

In the pulse heat method, the tool 4 is initially heated to a predetermined temperature, and, thereafter, the tool 4 is cooled so as to control an amount of the heat transmitted to the semiconductor device 1 and the electrically non-conductive adhesive 7. The cooling of the tool 4 can be achieved either by air cooling or water cooling. In consideration of the semiconductor device 1 being held on the tool 4 and an accurate temperature control, the water cooling is preferable.

Accordingly, when the semiconductor device 1 is moved to the position above the mounting substrate 6 and is mounted thereto, the electrically non-conductive adhesive 7 has been cured to a certain level due to the heat from the tool 4. Thus, the viscosity of the electrically non-conductive adhesive 7 has been increased. That is, when the semiconductor device 1 is mounted to the mounting substrate 6, the electrically non-conductive adhesive 7 has been cured to a certain level. Thus, the curing time of the electrically non-conductive adhesive 7 after being mounted can be reduced.

As mentioned above, in the mounting method according to the third embodiment of the present invention, the electrically conductive adhesive 5 used in the conventional mounting method is not used, and the stud bumps 2 are directly bonded to the lands 6a of the mounting substrate 2. Accordingly, there is no need to perform the process for applying the electrically conductive adhesive 5, and instead the electrically non-conductive adhesive 7 is applied to the semiconductor device 1 simultaneously with the leveling of the stud bumps 2.

As mentioned above, by applying the electrically non-conductive adhesive 7 to the semiconductor device 1 while the leveling is performed, there is no need to perform the process for applying the electrically non-conductive adhesive 7 alone. Therefore, the number of processes to be performed is reduced, and the tact of the mounting process is also reduced. Additionally, since the expensive electrically conductive adhesive is not used, the material cost can be reduced. Further, since the electrically non-conductive adhesive 7 is heated by the pulse heat method and the mounting of the semiconductor device 1 is performed subsequent to the leveling, the cure of the electrically non-conductive adhesive 7 is initiated during the leveling. Thus, a time period spent on the cure of the electrically non-conductive adhesive 7 in the tact of the mounting process can be substantially reduced.

Figure 11:
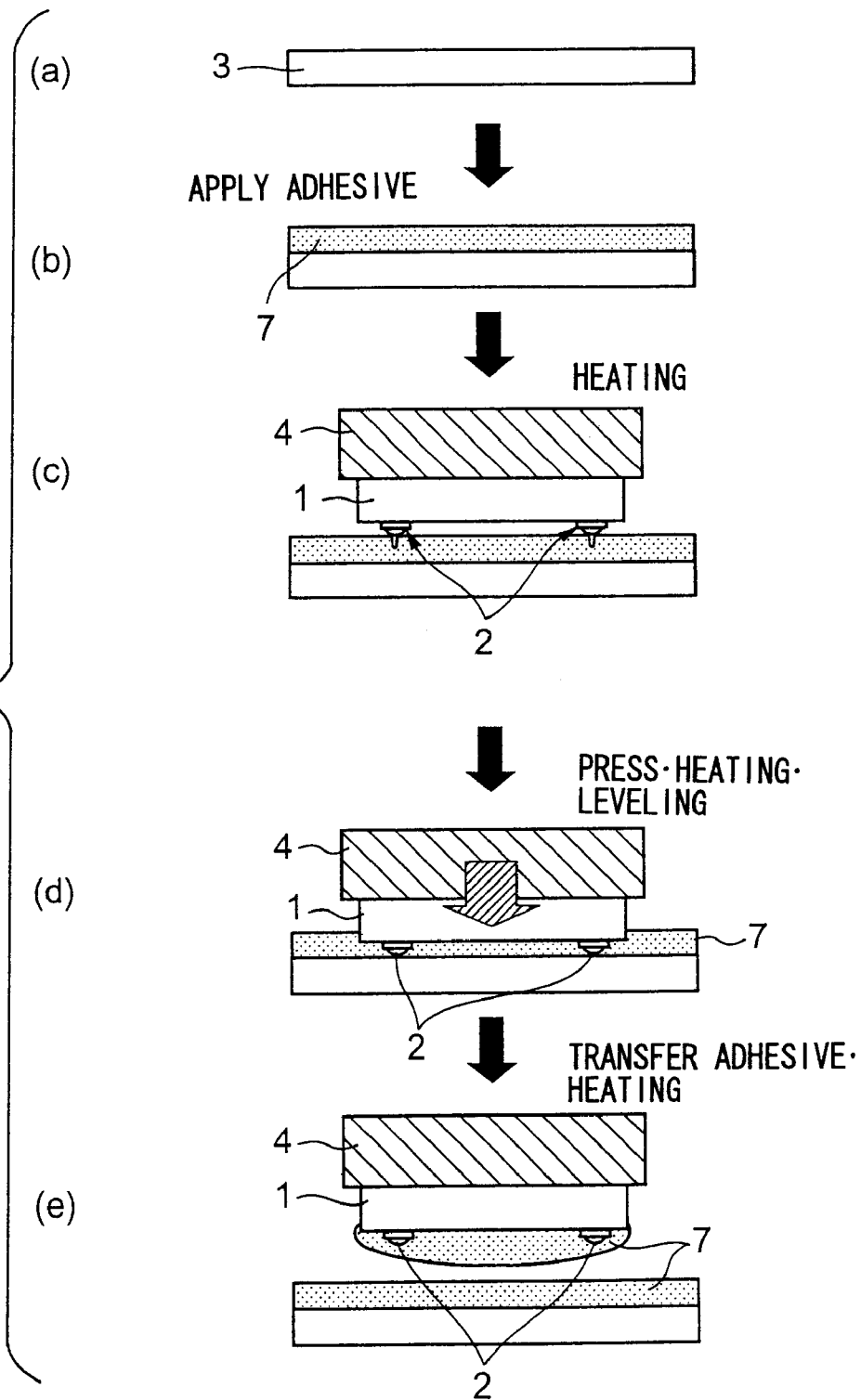
FIG. 11 is an illustration for explaining a semiconductor mounting method according to a fourth embodiment of the present invention.

A description will now be given, with reference to FIG. 11, of a fourth embodiment of the present invention. FIG. 11 is an illustration for explaining a semiconductor device mounting method according to the fourth embodiment of the present invention. In FIG. 11, parts that are the same as the parts shown in FIG. 2 are given the same reference numerals, and descriptions thereof will be omitted.

First, as shown in FIG. 11-(a), the hard material plate 3 having a planer surface is prepared. The hard material plate 3 is made of a hard material such as ceramics. Then, as shown in FIG. 11-(b), the electrically non-conductive adhesive in the state of liquid is applied to the hard material plate 3 with a uniform thickness.

A process for applying the electrically non-conductive adhesive 7 with a uniform thickness is the same as the process explained in the above-mentioned first embodiment with reference to FIG. 8, and descriptions thereof will be omitted.

After the electrically no-conductive adhesive 7 in the form of liquid is applied to the planer surface of the hard material plate 3, the semiconductor device 1 on which the stud bumps 2 are formed is held by the tool 4 and is moved to a position above the hard material plate 3 as shown in FIG. 11-(c). At this time, the tool 4 is heated according to the constant heat method.

In the constant heat method, the temperature of the tool 4 is continuously maintained at a constant temperature such as 150° C. Accordingly, in the constant heat method, the tool 4 is in a heated state when the semiconductor device 1 is attached to the tool 4.

Then, as shown in FIG. 11-(d), the stud bumps 2 are subject to leveling by being pressed against the planer surface of the hard material plate 3. At this time, the tool 4 is heated by the constant heat method while the tool 4 presses the semiconductor device 1 for the leveling. Thereby, the curing reaction of the electrically non-conductive material 7 applied to the semiconductor device 1 is initiated due to the heat from the tool 4.

After the leveling of the stud bumps 2 is completed, the semiconductor device 1 is moved away from the hard material plate 3. Thereby, a predetermined amount of the electrically non-conductive adhesive 7 adheres to the mounting surface of the semiconductor device 1. That is, the state shown in FIG. 11-(e) corresponds to the state shown in shown in FIG. 6-(b). Thereafter, the semiconductor device 1 is moved to a position above the mounting substrate 6 while being held by the tool 4, and the semiconductor device 1 is mounted onto the mounting substrate 6. The tool 4 is heated according to a pulse heat method so that the tool 4 is continuously heated until the semiconductor device 1 is mounted to the mounting substrate 6.

Accordingly, when the semiconductor device 1 is moved to the position above the mounting substrate 6 and is mounted thereto, the electrically non-conductive adhesive 7 has been cured to a certain level due to the heat from the tool 4. Thus, the viscosity of the electrically non-conductive adhesive 7 has been increased. That is, when the semiconductor device 1 is mounted to the mounting substrate 6, the electrically non-conductive adhesive 7 has been cured to a certain level. Thus, the curing time of the electrically non-conductive adhesive 7 after being mounted can be reduced.

As mentioned above, in the mounting method according to the fourth embodiment of the present invention, the electrically conductive adhesive 5 used in the conventional mounting method is not used, and the stud bumps 2 are directly bonded to the lands 6a of the mounting substrate 2. Accordingly, there is no need to perform the process for applying the electrically conductive adhesive 5, and instead the electrically non-conductive adhesive 7 is applied to the semiconductor device 1 simultaneously with the leveling of the stud bumps 2.

As mentioned above, by applying the electrically non-conductive adhesive 7 to the semiconductor device 1 while the leveling is performed, there is no need to perform the process for applying the electrically non-conductive adhesive 7 alone. Therefore, the number of processes to be performed is reduced, and the tact of the mounting process is also reduced. Additionally, since the expensive electrically conductive adhesive is not used, the material cost can be reduced. Further, since the electrically non-conductive adhesive 7 is heated prior to the leveling and the mounting of the semiconductor device 1 is performed immediately after the leveling, the cure of the electrically non-conductive adhesive 7 is initiated during the leveling. Thus, a time period spent on the cure of the electrically non-conductive adhesive 7 in the tact of the mounting process can be substantially reduced.

Figure 12:
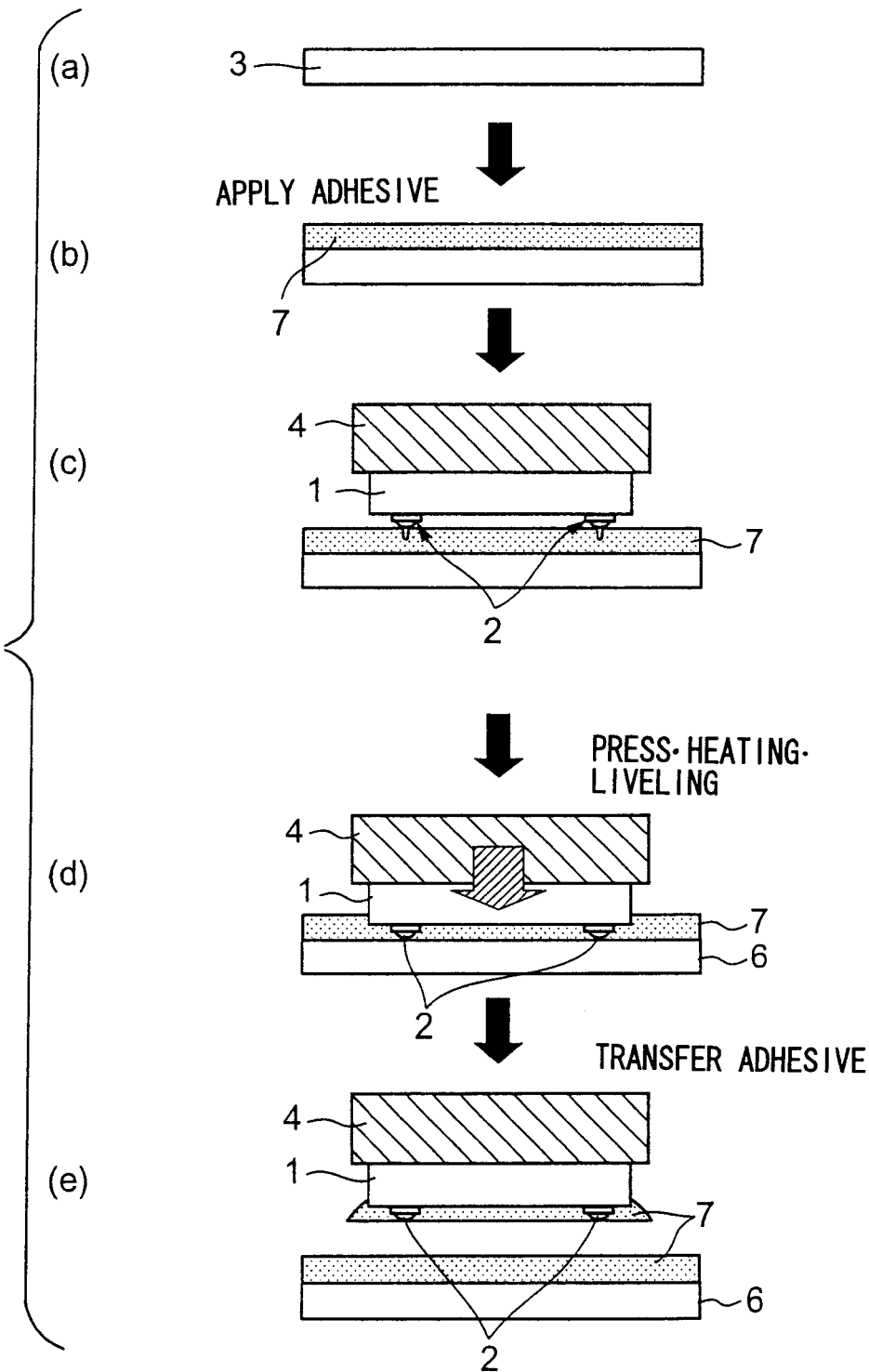
FIG. 12 is an illustration for explaining a semiconductor mounting method according to a fifth embodiment of the present invention.

A description will now be given, with reference to FIG. 12, of a fifth embodiment of the present invention. FIG. 12 is an illustration for explaining a semiconductor device mounting method according to the fifth embodiment of the present invention. In FIG. 12, parts that are the same as the parts shown in FIG. 2 are given the same reference numerals, and descriptions thereof will be omitted.

First, as shown in FIG. 12-(a), the hard material plate 3 having a planer surface is prepared. The hard material plate 3 is made of a hard material such as ceramics. Then, as shown in FIG. 12-(b), the electrically non-conductive adhesive in the state of liquid is applied to the hard material plate 3 with a uniform thickness.

A process for applying the electrically non-conductive adhesive 7 with a uniform thickness is the same as the process explained in the above-mentioned first embodiment with reference to FIG. 8, and descriptions thereof will be omitted.

After the electrically no-conductive adhesive 7 in the form of liquid is applied to the planer surface of the hard material plate 3, the semiconductor device 1 on which the stud bumps 2 are formed is held by the tool 4 and is moved to a position above the hard material plate 3 as shown in FIG. 12-(c). Then, as shown in FIG. 12-(d), the stud bumps 2 are subject to leveling by being pressed against the planer surface of the hard material plate 3. At this time, the tool 4 is heated while the tool 4 presses the semiconductor device 1 to level the stud bumps 2. Thereby, the curing reaction of the electrically non-conductive adhesive 7 applied to the semiconductor device 1 is initiated.

After the leveling of the stud bumps 2 is completed, the semiconductor device 1 is moved away from the hard material plate 3. Thereby, a predetermined amount of the electrically non-conductive adhesive 7 adheres to the mounting surface of the semiconductor device 1 as shown in FIG. 12-(e). In this state, the tool 4 is heated according to a pulse heat method so that the electrically non-conductive adhesive 7 near the mounting surface of the semiconductor device 1 adheres to the semiconductor device 1 in a gelatinized state (semi-cured state).

The state shown in FIG. 12-(e) corresponds the state shown in FIG. 6-(b). Thereafter, the semiconductor device 1 is moved to a position above the mounting substrate 6 while being held by the tool 4, and the semiconductor device 1 is mounted to the mounting substrate 6.

Accordingly, when the semiconductor device 1 is moved to the position above the mounting substrate 6 and is mounted thereto, the cure of the electrically non-conductive adhesive 7 has been advanced and is in the gelatinized state (semi-cured state) due to the heat from the tool 4. The electrically non-conductive adhesive 7 in the gelatinized state has a low fluidity, and the end surfaces of the stud bumps 2 to be bonded are exposed on the surface of the electrically non-conductive adhesive 7 on the semiconductor device 1. Thereby, the stud bumps 2 can be connected to the lands 6a of the mounting substrate 6 by merely contacting the exposed surfaces of the stud bumps 2 to the lands 6, and there is no need to heat the semiconductor device by the tool 4 after the stud bumps 2 are put into contact with the lands 6a.

The semiconductor device 1 is fixed onto the mounting substrate 6 by the electrically non-conductive adhesive 7 in the form of a gel by merely placing the semiconductor device 1 on the mounting area of the mounting substrate 6. Thus, the electrically non-conductive adhesive 7 can be completely cured by placing the mounting substrate 6 in a heating furnace immediately after the semiconductor device 1 is mounted thereto. That is, by rendering the electrically non-conductive adhesive 7 to be in the gelatinized state prior to mounting, the semiconductor device 1 can be fixed on the mounting substrate 6 by merely placing the semiconductor device 1 on the mounting area so that the semiconductor device 1 does not move due to a movement of the mounting substrate 6. Thus, there is no need to press and heat the semiconductor device 1 by the tool 4 after the semiconductor device 1 is mounted to the mounting substrate 6.

As mentioned above, in the mounting method according to the fifth embodiment of the present invention, the electrically conductive adhesive 5 used in the conventional mounting method is not used, and the stud bumps 2 are directly bonded to the lands 6a of the mounting substrate 2. Accordingly, there is no need to perform the process for applying the electrically conductive adhesive 5, and instead the electrically non-conductive adhesive 7 is applied to the semiconductor device 1 simultaneously with the leveling of the stud bumps 2.

As mentioned above, by applying the electrically non-conductive adhesive 7 to the semiconductor device 1 while the leveling is performed, there is no need to perform the process for applying the electrically non-conductive adhesive 7 alone. Therefore, the number of processes to be performed is reduced, and the tact of the mounting process is also reduced. Additionally, since the expensive electrically conductive adhesive is not used, the material cost can be reduced. Further, since the electrically non-conductive adhesive 7 is heated according to the pulse heat method during the leveling and the mounting of the semiconductor device 1 is performed immediately after the leveling, the cure of the electrically non-conductive adhesive 7 is initiated during the leveling. Thus, a time period spent on the cure of the electrically non-conductive adhesive 7 in the tact of the mounting process can be substantially reduced.

Figure 13:
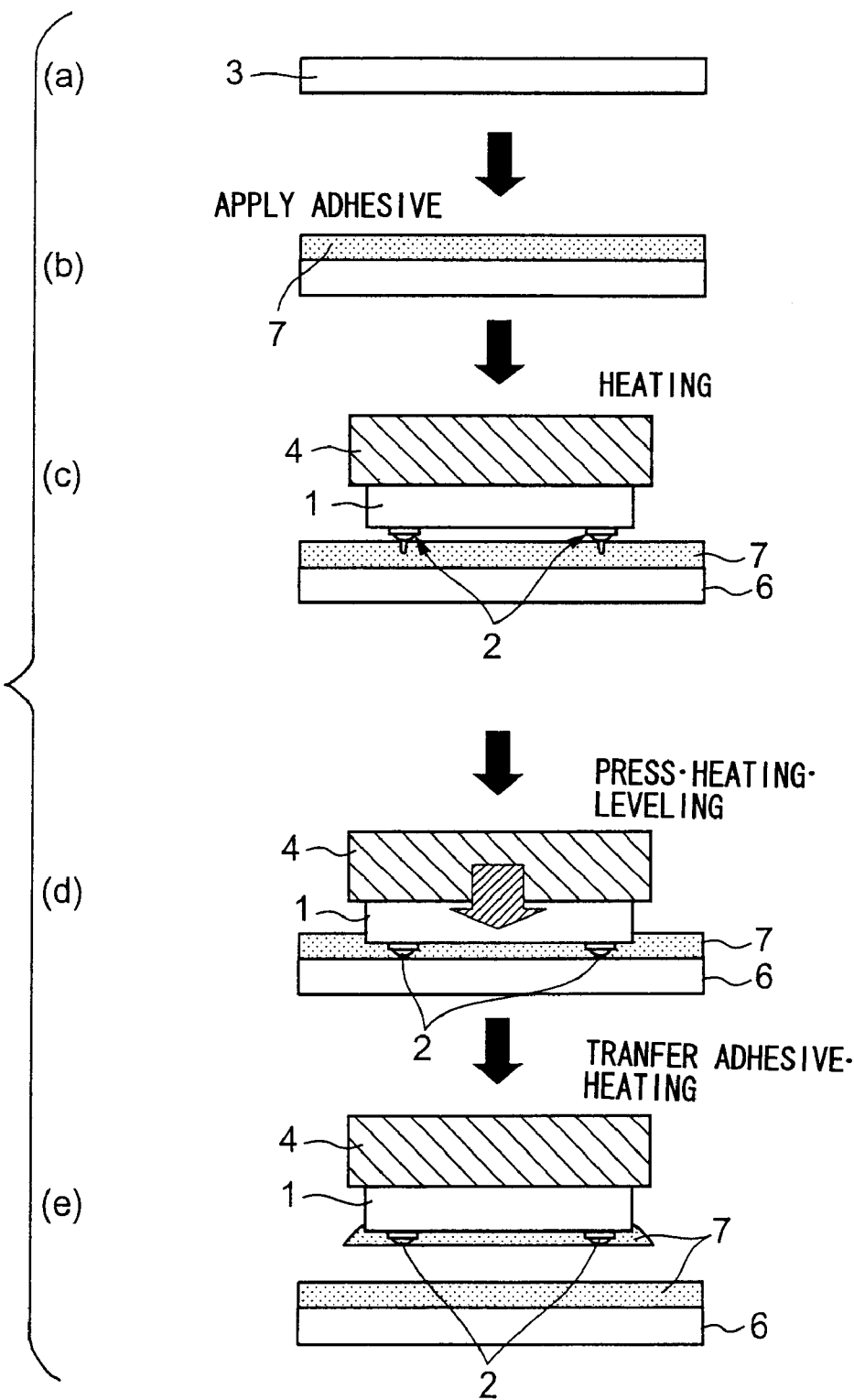
FIG. 13 is an illustration for explaining a semiconductor mounting method according to a sixth embodiment of the present invention.

A description will now be given, with reference to FIG. 13, of a sixth embodiment of the present invention. FIG. 13 is an illustration for explaining a semiconductor device mounting method according to the sixth embodiment of the present invention. In FIG. 13, parts that are the same as the parts shown in FIG. 2 are given the same reference numerals, and descriptions thereof will be omitted.

First, as shown in FIG. 13-(a), the hard material plate 3 having a planer surface is prepared. The hard material plate 3 is made of a hard material such as ceramics. Then, as shown in FIG. 13-(b), the electrically non-conductive adhesive in the state of liquid is applied to the hard material plate 3 with a uniform thickness.

A process for applying the electrically non-conductive adhesive 7 with a uniform thickness is the same as the process explained in the above-mentioned first embodiment with reference to FIG. 8, and descriptions thereof will be omitted.

After the electrically no-conductive adhesive 7 in the form of liquid is applied to the planer surface of the hard material plate 3, the semiconductor device 1 on which the stud bumps 2 are formed is held by the tool 4 and is moved to a position above the hard material plate 3 as shown in FIG. 13-(c). At this time, the tool 4 is heated according to the constant heat method.

In the constant heat method, the temperature of the tool 4 is continuously maintained at a constant temperature such as 150° C. Accordingly, in the constant heat method, the tool 4 is in a heated state when the semiconductor device 1 is attached to the tool 4.

Then, as shown in FIG. 13-(d), the stud bumps 2 are subject to leveling by being pressed against the planer surface of the hard material plate 3. At this time, the tool 4 is heated by the constant heat method while the tool 4 presses the semiconductor device 1 for the leveling. Thereby, the curing reaction of the electrically non-conductive material 7 applied to the semiconductor device 1 is initiated due to the heat from the tool 4. That is, the state shown in FIG. 13-(e) corresponds to the state shown in shown in FIG. 6-(b). Thereafter, the semiconductor device 1 is moved to a position above the mounting substrate 6 while being held by the tool 4, and the semiconductor device 1 is mounted onto the mounting substrate 6. The tool 4 is heated according to a pulse heat method so that the tool 4 is continuously heated until the semiconductor device 1 is mounted to the mounting substrate 6.

Accordingly, when the semiconductor device 1 is moved to the position above the mounting substrate 6 and is mounted thereto, the cure of the electrically non-conductive adhesive 7 has been advanced and is in the gelatinized state (semi-cured state) due to the heat from the tool 4. Thus, the curing time of the electrically non-conductive adhesive 7 after being mounted can be reduced.

As mentioned above, in the mounting method according to the sixth embodiment of the present invention, the electrically conductive adhesive 5 used in the conventional mounting method is not used, and the stud bumps 2 are directly bonded to the lands 6a of the mounting substrate 2. Accordingly, there is no need to perform the process for applying the electrically conductive adhesive 5, and instead the electrically non-conductive adhesive 7 is applied to the semiconductor device 1 simultaneously with the leveling of the stud bumps 2.

As mentioned above, by applying the electrically non-conductive adhesive 7 to the semiconductor device 1 while the leveling is performed, there is no need to perform the process for applying the electrically non-conductive adhesive 7 alone. Therefore, the number of processes to be performed is reduced, and the tact of the mounting process is also reduced. Additionally, since the expensive electrically conductive adhesive is not used, the material cost can be reduced. Further, since the electrically non-conductive adhesive 7 is heated prior to the leveling and the mounting of the semiconductor device 1 is performed subsequent to the leveling, the cure of the electrically non-conductive adhesive 7 is initiated during the leveling. Thus, a time period spent on the cure of the electrically non-conductive adhesive 7 in the tact of the mounting process can be substantially reduced.

A description will now be given of other effects of the mounting methods according to the above-mentioned embodiments. In the above-mentioned embodiments, the tact of the mounting process (step S24 of FIG. 5) is reduced. By taking the advantage of the reduction in the tact, a plurality of mounting processes performed by a plurality of bonding heads, each of which corresponds to the tool 4, can be performed in an efficient manner.

Figure 14:
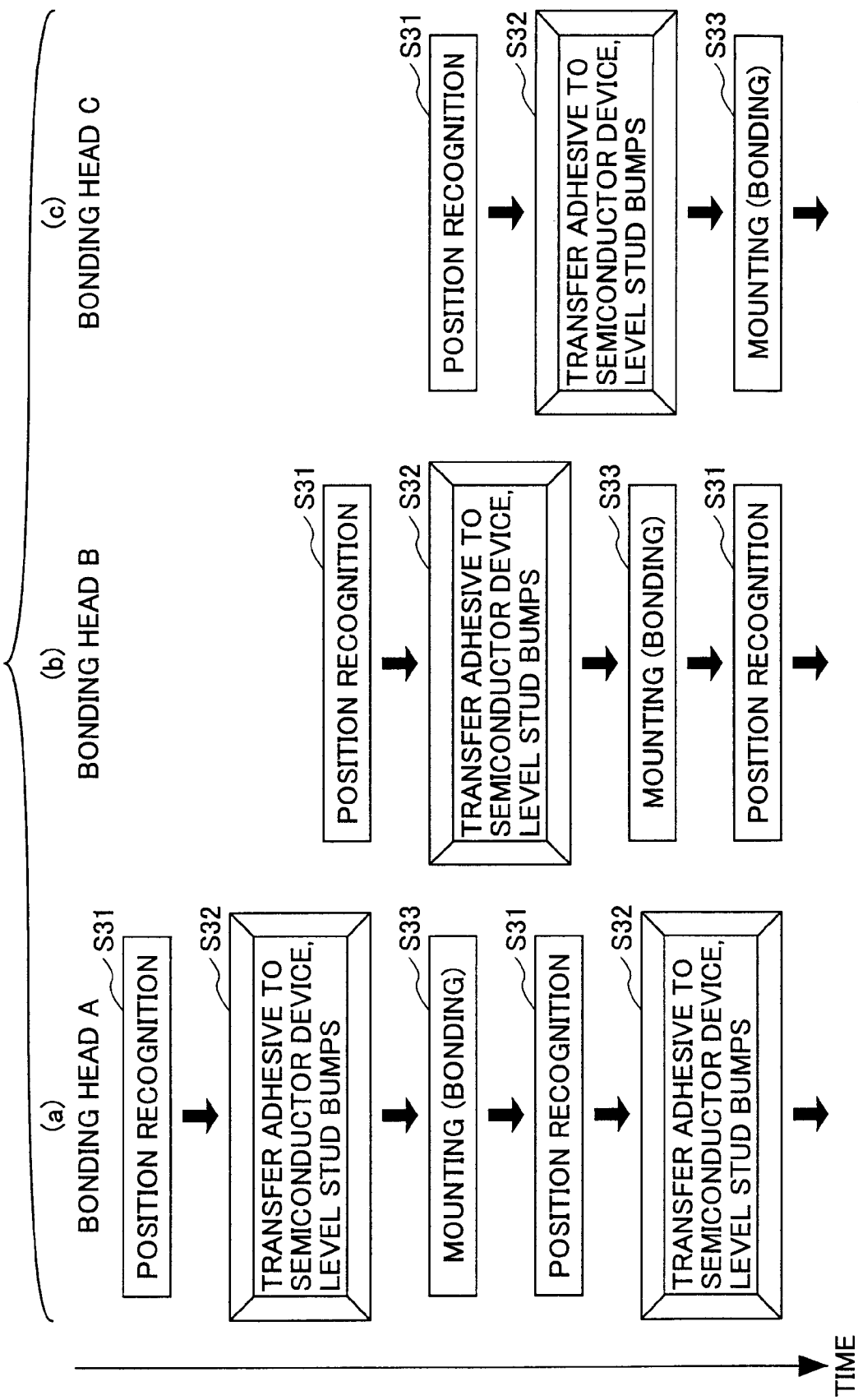
FIG. 14 is an illustration for explaining a semiconductor mounting process performed by a plurality of bonding heads.

FIG. 14 is a flowchart of a plurality of mounting processes each of which is performed with different bonding heads. In a case shown in FIG. 14, bonding heads A, B and C are provided each of which performs the mounting process shown in FIG. 5.

In the mounting process shown in FIG. 14, each of the bonding heads repeats the same mounting process, but the step is shifted from one bonding head to another bonding head. That is, the bonding head A repeats the mounting process including: the step of position recognition (steps S31); the step of leveling of the stud bumps 2 and transferring the electrically non-conductive adhesive 7 (step S32); and the step of mounting (step S33). The position recognition of step S31 corresponds to the process of step S22 in FIG. 5. The leveling and transferring of the step S32 corresponds to the process of step S23 in FIG. 5. The mounting of step S33 corresponds to the process of step S24 in FIG. 5.

Similar to the bonding head A, the bonding head B also repeats the mounting process including the steps S31 to S33. However, when the bonding head A performs the process of step S32, the bonding head B performs the process of step S31. Similarly, the bonding head performs the process of step S31 when the bonding head A performs the process of step S33 and the bonding head C performs the process of step S32.

By performing the mounting process by shifting the steps one by one from one bonding head to another bonding head, a higher productivity of the semiconductor device can be achieved than a case in which the mounting process is performed by using a single bonding head. In order to achieve a plurality of mounting processes by shifting the steps one by one, the tact of the processes of the steps must be substantially equal to each other. Otherwise the efficiency of the entire mounting process may be decreased. However, according to the above-mentioned embodiments, the curing time of the electrically non-conductive adhesive 7 can be reduced or substantially eliminated, and, thereby, the mounting process can be performed by a plurality of bonding heads without decreasing the efficiency.

The present invention is not limited to the specifically disclosed embodiments, and variations and modifications may be made without departing from the scope of the present invention.

The present application is based on Japanese priority application No. 2000-046621 file on Feb. 23, 2000, the entire contents of which are hereby incorporated by reference.

What is claimed is:

1. A method for mounting a semiconductor device having a plurality of stud bumps to a mounting substrate, the method comprising the steps of:

applying an electrically non-conductive adhesive to a planar surface of a hard material member;

attaching the semiconductor device to a bonding head;

leveling the stud bumps of the semiconductor device by pressing the stud bumps against the planar surface of the hard material member by the bonding head, and transferring a predetermined amount of the electrically non-conductive adhesive to a mounting area of the semiconductor device by separating the semiconductor device from the planar surface of the hard material member, wherein the steps of leveling the stud bumps and transferring the electrically conductive adhesive are performed simultaneously, and fixing the semiconductor device to the mounting substrate by placing the semiconductor device on the mounting substrate and curing the electrically non-conductive adhesive on the mounting surface of the semiconductor device.

2. The method as claimed in claim 1, wherein the electrically non-conductive adhesive is in the form of a film so that the film is applied to the planar surface of the hard material member.

3. A method for mounting a semiconductor device having a plurality of stud bumps to a mounting substrate, the method comprising the steps of:

applying an electrically non-conductive adhesive to a planar surface of a hard material member, the electrically non-conductive adhesive made of a thermosetting resin;

attaching the semiconductor device to a bonding head;

leveling the stud bumps of the semiconductor device by pressing the stud bumps against the planar surface of the hard material member by the bonding head, and heating the bonding head so as to heat the electrically non-conductive adhesive via the semiconductor device, and transferring a predetermined amount of the electrically non-conductive adhesive to a mounting area of the semiconductor device by separating the semiconductor device from the planar surface of the hard material member, wherein the steps of leveling the stud bumps and transferring the electrically conductive adhesive are performed simultaneously, and fixing the semiconductor device to the mounting substrate by placing the semiconductor device on the mounting substrate and curing the electrically non-conductive adhesive on the mounting surface of the semiconductor device.

4. The method as claimed in claim 3, wherein the electrically non-conductive adhesive is in the liquid state when being applied to the planar surface of the hard material member so that the electrically non-conductive adhesive on the planar surface has a uniform thickness.

5. The method as claimed in claim 4 wherein the semiconductor device is separated from the hard material member after the electrically non-conductive adhesive becomes a gelatinized state by being heated in the process of transferring the electrically non-conductive material.

6. A method for mounting a semiconductor device having a plurality of stud bumps to a mounting substrate, the method comprising the steps of:

applying an electrically non-conductive adhesive to a planar surface of a hard material member, the electrically non-conductive adhesive made of a thermosetting resin;

attaching the semiconductor device to a bonding head;

leveling the stud bumps of the semiconductor device by pressing the stud bumps against the planar surface of the hard material member by using the bonding head after being heated, and heating the bonding head so as to heat the electrically non-conductive adhesive via the semiconductor device and transferring a predetermined amount of the electrically non-conductive adhesive to a mounting area of the semiconductor device by separating the semiconductor device from the planar surface of the hard material member, wherein the steps of leveling the stud bumps and transferring the electrically conductive adhesive are performed simultaneously; and fixing the semiconductor device to the mounting substrate by placing the semiconductor device on the mounting substrate and thermally curing the electrically non-conductive adhesive on the mounting surface of the semiconductor device.

7. The method as claimed in claim 6, wherein the electrically non-conductive adhesive is in the liquid state when being applied to the planar surface of the hard material member so that the electrically non-conductive adhesive on the planar surface has a uniform thickness.

8. The method as claimed in claim 7 wherein the semiconductor device is separated from the hard material member after the electrically non-conductive adhesive becomes a gelatinized state by being heated in the process of transferring the electrically non-conductive adhesive.

9. A method for mounting a plurality of semiconductor devices, each of which having a plurality of stud bumps, to a mounting substrate by using a plurality of bonding heads, a process of mounting each of the semiconductor devices comprising the steps of:

recognizing a position of one of the semiconductor devices attached to one of the bonding heads, and applying an electrically non-conductive adhesive to a planar surface of a hard material member;

leveling the stud bumps of one of the semiconductor device by pressing the stud bumps against the planar surface of the hard material member by the bonding head, and transferring a predetermined amount of the electrically non-conductive adhesive to a mounting area of one of the semiconductor devices by separating the one of the semiconductor devices from the planar surface of the hard material member, wherein the steps of leveling the stud bumps and transferring the electrically conductive adhesive are performed simultaneously; and fixing the one of the semiconductor devices to the mounting substrate by placing the one of the semiconductor device on the mounting substrate and curing the electrically non-conductive adhesive on the mounting surface of the one of the semiconductor devices, wherein the process of mounting is sequentially repeated with respect to each of the bonding heads in a manner in which the process of mounting with respect to one of the bonding heads is shifted by one step from the process of mounting with respect to another one of the bonding heads.

10. A method for mounting a plurality of semiconductor devices, each of which having a plurality of stud bumps, to a mounting substrate by using a plurality of bonding heads, a process of mounting each of the semiconductor devices comprising the steps of:

recognizing a position of one of the semiconductor devices attached to one of the bonding heads, and applying an electrically non-conductive adhesive to a planar surface of a hard material member, the electrically non-conductive adhesive made of a thermosetting resin;

leveling the stud bumps of one of the semiconductor device by pressing the stud bumps against the planar surface of the hard material member by the one of the bonding heads, and heating the bonding head so as to heat the electrically non-conductive adhesive via the one of the semiconductor devices, and transferring a predetermined amount of the electrically non-conductive adhesive to a mounting area of one of the semiconductor devices by separating the one of the semiconductor devices from the planar surface of the hard material member, wherein the steps of leveling the stud bumps and transferring the electrically conductive adhesive are performed simultaneously; and fixing the one of the semiconductor devices to the mounting substrate by placing the one of the semiconductor devices on the mounting substrate and thermally curing the electrically non-conductive adhesive on the mounting surface of the one of the semiconductor devices, wherein the process of mounting is sequentially repeated with respect to each of the bonding heads in a manner in which the process of mounting with respect to one of the bonding heads is shifted by one step from the process of mounting with respect to another one of the bonding heads.

11. A method for mounting a plurality of semiconductor devices, each of which having a plurality of stud bumps, to a mounting substrate by using a plurality of bonding heads, a process of mounting each of the semiconductor devices comprising the steps of:

recognizing a position of one of the semiconductor devices attached to one of the bonding heads, and applying an electrically non-conductive adhesive to a planar surface of a hard material member, the electrically non-conductive adhesive made of a thermosetting resin;

leveling the stud bumps of the one of the semiconductor device by pressing the stud bumps against the planar surface of the hard material member by using the one of the bonding heads so as to heat the electrically non-conductive adhesive via the one of the semiconductor devices and transferring a predetermined amount of the electrically non-conductive adhesive to a mounting area of one of the semiconductor devices by separating the one of the semiconductor devices from the planar surface of the hard material member, wherein the steps of leveling the stud bumps and transferring the electrically conductive adhesive are performed simultaneously; and fixing the one of the semiconductor devices to the mounting substrate by placing the one of the semiconductor devices on the mounting substrate and thermally curing the electrically non-conductive adhesive on the mounting surface of the one of the semiconductor devices, wherein the process of mounting is sequentially repeated with respect to each of the bonding heads in a manner in which the process of mounting with respect to one of the bonding heads is shifted by one step from the process of mounting with respect to another one of the bonding heads.

\* \* \* \* \*